(12) United States Patent
Thompson et al.

(10) Patent No.: US 7,779,776 B2
(45) Date of Patent: Aug. 24, 2010

(54) POLYCERAMIC-COATED TOOL FOR APPLYING A FLOWABLE COMPOSITION

(75) Inventors: Jesse Burl Thompson, Brentwood, CA (US); Hilda Cantor Tadio, San Jose, CA (US); Salvador A. Tostado, Los Gatos, CA (US); Apolinar Alvarez, Jr., Fremont, CA (US)

(73) Assignee: Tessera, Inc., San Jose, CA (US)

( * ) Notice: Subject to any disclaimer, the term of this patent is extended or adjusted under 35 U.S.C. 154(b) by 1134 days.

(21) Appl. No.: 11/183,490

(22) Filed: Jul. 18, 2005

(65) Prior Publication Data

US 2007/0015310 A1  Jan. 18, 2007

(51) Int. Cl.
*B05B 15/04* (2006.01)

(52) U.S. Cl. .................. 118/301; 118/213; 118/406

(58) Field of Classification Search ............. 118/213, 118/301, 406; 101/127, 126, 127.1, 128, 101/128.1, 128.2, 128.4; 433/219, 217.1
See application file for complete search history.

(56) References Cited

U.S. PATENT DOCUMENTS

| | | | | |
|---|---|---|---|---|
| 4,756,977 | A * | 7/1988 | Haluska et al. | 428/704 |
| 5,669,970 | A | 9/1997 | Balog et al. | |
| 5,695,339 | A * | 12/1997 | Abere | 433/218 |
| 5,814,397 | A * | 9/1998 | Cagliostro et al. | 428/216 |
| 5,853,894 | A | 12/1998 | Brown | |
| 6,001,671 | A | 12/1999 | Fjelstad | |
| 6,156,389 | A | 12/2000 | Brown | |
| 6,378,199 | B1 * | 4/2002 | Yoshinuma et al. | 29/830 |
| 6,447,979 | B1 | 9/2002 | Hattori | |
| 6,495,624 | B1 | 12/2002 | Brown | |
| 6,592,943 | B2 | 7/2003 | Chan et al. | |
| 6,652,281 | B1 | 11/2003 | Eckhardt | |
| 6,663,941 | B2 | 12/2003 | Brown | |
| 6,767,587 | B1 | 7/2004 | Brown | |
| 2002/0103304 | A1 * | 8/2002 | Hintzer et al. | 525/326.2 |
| 2004/0224535 | A1 | 11/2004 | Light et al. | |
| 2006/0138599 | A1 | 6/2006 | Thompson | |
| 2006/0150847 | A1 * | 7/2006 | Deutsch et al. | 101/467 |
| 2006/0281049 | A1 * | 12/2006 | Ho | 433/173 |

OTHER PUBLICATIONS

"Coatings Offer Promise of More Productivity," Design News for Mechanical and Design Engineers, Jan. 12, 2005.

* cited by examiner

*Primary Examiner*—Yewebdar T Tadesse
(74) *Attorney, Agent, or Firm*—Lerner, David, Littenberg, Krumholz & Mentlik, LLP

(57) ABSTRACT

A tool is provided for applying a flowable composition onto a receiving surface. The tool includes a polyceramic coating on a surface thereof and may take the form of a stencil or mold. Also provided are an apparatus and a method that uses the tool. In use, the tool is placed such that its polyceramic-coated surface is in contact with the flowable composition, which, in turn, simultaneously contacts the receiving surface.

9 Claims, 4 Drawing Sheets

POLYCERAMIC-COATED TOOL FOR APPLYING A FLOWABLE COMPOSITION

FIELD OF THE INVENTION

The present invention relates generally to a polyceramic-coated tool for applying a flowable composition. In particular, the invention relates to a polyceramic-coated tool that exhibits superior release performance in applications such as those involving the placement of solder pastes and/or molding compounds. Also provided are methods and apparatuses that use such tools.

BACKGROUND OF THE INVENTION

Flowable compositions such as molding compounds and solder paste are commonly used in the semiconductor industry for a variety of applications, e.g., formation of packages and electrical connections. As microelectronic devices and packaging have become increasingly miniaturized, there is a growing need to control placement of such flowable compositions with greater precision. Accordingly, the tools associated with the application of flowable compositions are evolving to meet these challenges.

Stencils, for example, represent a class of tools known for their use in applying flowable compositions such as inks and pastes on surfaces of substrates. In particular, stencils may be used to form flip-chip packages which require protrusions such as metal bumps or balls to be placed or fabricated on each bonding pad of a substrate, e.g., a semiconductor die. Such protrusions can be solder or another metal. "Bumping" may be performed when the semiconductor dies are still connected to one another in wafer form. Typically, solder features are deposited via stencil printing, and the deposited features are reflowed to form spherical balls, or bumps. Similarly, flowable compositions such as molding compounds also require tools such as molds, injectors, and the like to control their placement.

As features associated with stencils, molds, and other tools for controlling the placement of flowable compositions become smaller, surface forces become increasingly dominant over bulk fluid effects. Accordingly, at or below certain feature sizes, flowable compositions undesirably and/or uncontrollably adhere to the surfaces of the tools. In turn, rework or more costly alternatives may be required to achieve the required precision for the placement of the flowable compositions.

Polyceramics are a class of materials containing both polymeric and ceramic components. For example, polyacrylic acid may be reacted with silicate glass to form a polyceramic material. In some cases, a polyceramic may be formed through in situ polymerization. In dental applications, for example, a precursor polyceramic composition may undergo radiation initiated polymerization where it is applied to form polyceramic materials in situ. See, e.g., U.S. Pat. No. 6,652,281 to Eckhardt et al. Alternatively, polyceramic coatings may be formed by spraying, brushing, wiping, or otherwise applying a layer of precursor liquid containing a solvent, and subjecting the liquid to conditions effective to form the coating. For example, precursor fluids containing chlorobenzotrifluoride as a solvent from NIC Industries Inc. (White City, Oreg.) may be applied to a surface of an item. Once the solvent is evaporated, the remaining components of the precursor liquid, under appropriate curing conditions, form a polyceramic coating on the surface.

Previously, polyceramic coatings have been applied to various items such as automotive parts and firearms. In addition, polyceramic coatings have been used as a graffiti-repelling paint. More recently, as described in U.S. patent application Ser. No. 11/025,439, entitled "Semiconductor Members Having A Halogenated Polymeric Coating And Methods For Their Formation," filed on Dec. 29, 2004, inventor Jesse Thompson, polyceramics coatings have found new applicability in the semiconductor microelectronic device industry. In particular, the described polyceramic coatings have been found to increase the strength of semiconductor members such as those used to form microelectronic chips and dies.

Nevertheless, there exist additional opportunities in the art to exploit the physical, mechanical, and chemical properties of polyceramic coating for apparatuses and tools associated with the semiconductor industry. In particular, a new use has been discovered for polyceramic coatings in the context of tooling for manipulating flowable compositions commonly used in microelectronic packaging to effect greater control over feature dimensions.

SUMMARY OF THE INVENTION

In a first aspect, the invention provides an apparatus for applying a flowable composition onto a receiving surface. The apparatus includes a tool having a polyceramic coating on a surface thereof and a means for placing the flowable composition in simultaneous contact with the polyceramic coating and the receiving surface. Exemplary tools include stencils and molds.

In another aspect, the invention provides a method for forming a microelectronic package. The method involves using a tool having a polyceramic coating on a surface thereof to place a flowable composition in simultaneous contact with the polyceramic coating and a receiving surface of at least one component of the microelectronic package. Once the composition is in place, the tool is removed from contact with the composition without substantially disturbing the composition. Due to the durability of the coating, the method may be repeated for at least one hundred additional microelectronic packages using the same tool to form substantially identical microelectronic packages.

Any of number of polyceramic materials may be used to form the coating. Typically, the coating contains a —SiO moiety. In some instances, the —SiO moiety may be provided in the form of silica. In addition or in the alternative, the —SiO moiety may represent a portion of a polymeric backbone and/or be pendant from a polymeric backbone. Regardless whether a —SiO moiety is present in the coating, the coating may contain a cyclic moiety, e.g., a benzyl moiety, and/or be fluorinated, chlorinated, or both.

The invention is suited for any of a number of different flowable compositions. For example, the flowable composition may include solder in the form of solder paste. In addition or in the alternative, the flowable composition may be polymeric or polymerizable in nature. For example, the invention may be used to handle epoxy-based formulations to form polymeric, e.g., plastic parts.

DETAILED DESCRIPTION

Before describing the present invention in detail, it is to be understood that the invention is not limited to specific microelectronic devices or types of electronic products, as such may vary. It is also to be understood that the terminology used herein is for the purpose of describing particular embodiments only, and is not intended to be limiting.

As used in this specification and the appended claims, the singular article forms "a," "an," and "the" include both singular and plural referents unless the context clearly dictates otherwise. Thus, for example, reference to "a coating" includes a plurality of coatings as well as a single coating, reference to "a surface" includes one or more surfaces, reference to "a composition" includes a single composition as well as a collection of compositions, and the like.

In addition, terminology indicative or suggestive of a particular spatial relationship between elements of the invention is to be construed in a relative sense rather an absolute sense unless the context of usage clearly dictates to the contrary. For example, the term "over" as used to describe the spatial orientation of a stencil relative to a substrate does not necessarily indicate that the stencil is located above the substrate. Thus, in a preform that includes a stencil placed over a substrate, the stencil may be located above, at the same level as, or below the substrate depending on the preform's orientation. Similarly, an "upper" surface of a substrate may lie above, at the same level as, or below other portions of the substrate depending on the orientation of the substrate.

In general, the invention pertains to the use of a polyceramic coating that improves the placement of a flowable composition such as solder paste or molding composition onto a receiving surface. The coating is typically provided on a surface of a tool such as a stencil or a mold for controlling the application of the flowable composition on the receiving surface. Once the composition is in place, the tool is removed from contact with the composition without substantially disturbing the composition. Due to the durability of the coating, the tool is suited for multiple repeat usage without substantial wear.

Figure 1A:
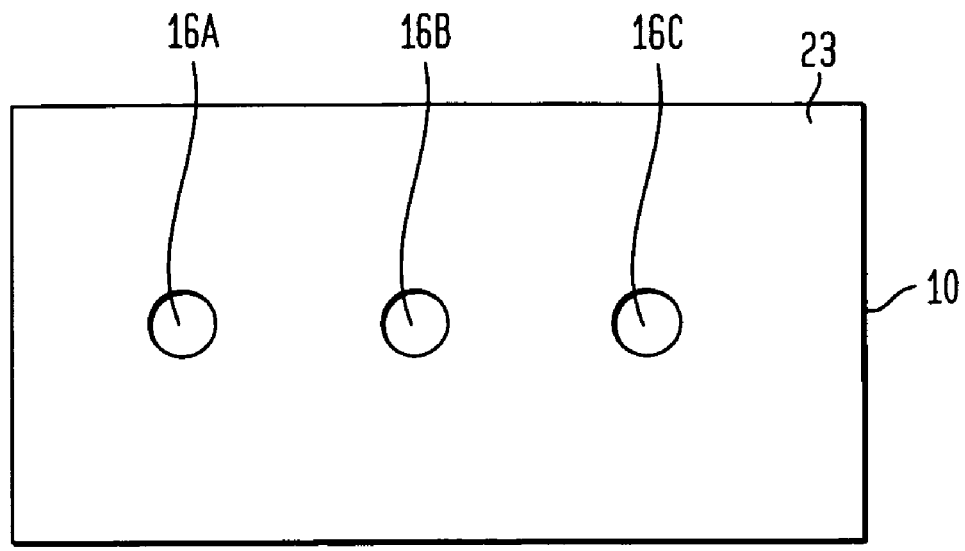
FIGS. 1A and 1B, collectively referred to as FIG. 1, schematically depict in top and cross-sectional views, respectively, an exemplary polyceramic-coated stencil for use in printing solder paste.
Figure 1B:
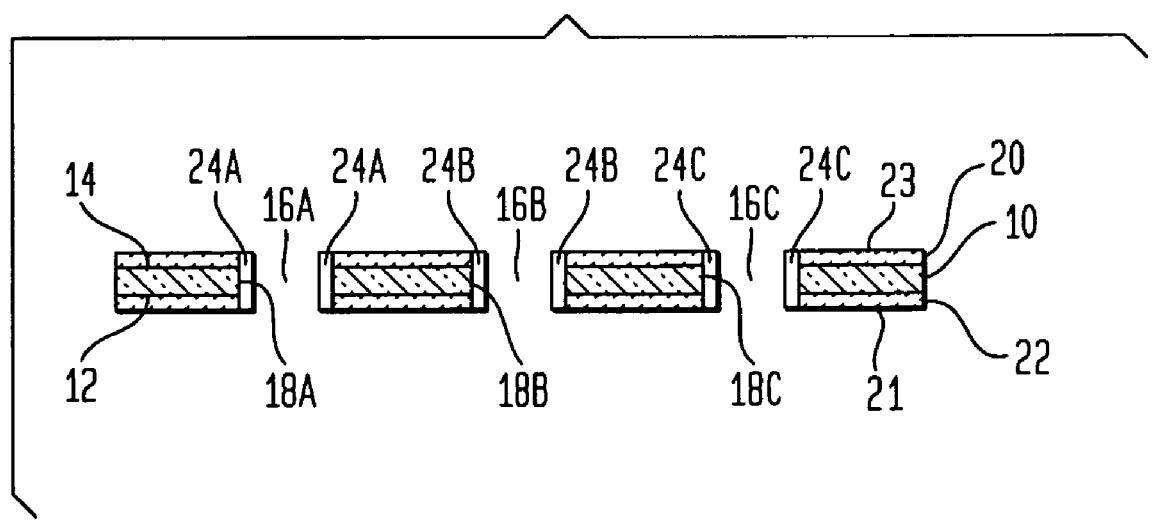

The invention may be used to supplement known technologies for applying flowable compositions and to overcome the disadvantages associated therewith. To illustrate the advantages of the invention, FIG. 1 depicts a tool 10 in the form of a stencil that may be used to print solder paste on a substrate. As with all figures referenced herein, in which like parts are referenced by like numerals, FIG. 1 is not necessarily to scale, and certain dimensions may be exaggerated for clarity of presentation. As shown, the stencil is a generally flat member having first and second major opposing parallel surfaces indicated at 12 and 14. Through-holes 16A-16C are bounded by luminal surfaces 18A-18C and extend perpendicularly from the first surface 12 to the second surface 14. As shown, the through-holes 16A-16C have an identical cross-sectional size and shape, but identical through-holes are not a requirement of the invention. The through-holes of stencils may have differing shapes and/or sizes arranged in array-like or other patterns depending the intended use of the stencil.

A first polyceramic coating 20 is located on and conforms to the first major surface 12. As a result, the first coating 20 forms an exterior surface 21 that is parallel to the first major member surface 12. An optional conformal second polyceramic coating 22 is shown on the second major surface 14. As a result, the second coating 22 forms exterior surface 23 that is parallel to the second major member surface 14. Optional luminal polyceramic coatings 24A-24C are also shown on the luminal surface 18A-18C, respectively.

FIG. 2 depicts the use of the stencil in FIG. 1 to print solder paste on a substrate 30 having a solder-receiving surface 32. As shown, the substrate 30 takes the form of a microelectronic semiconductor device having substantially planar and parallel front and rear surfaces, 32 and 34, respectively. In particular, the receiving surface may include one or more bond pads or contacts onto which the solder paste may be placed, as well as one or more solder masks for selectively protecting sections of the receiving surface from contact with any solder material. However, the invention is not limited to microelectronic devices. For example, the substrate may take any of a number of forms and may include, or consist of, a microelectronic element such as a semiconductor chip, a wafer, a circuit board, an interposer, or other items used in packaging applications of microelectronics and objects.

Figure 2A:
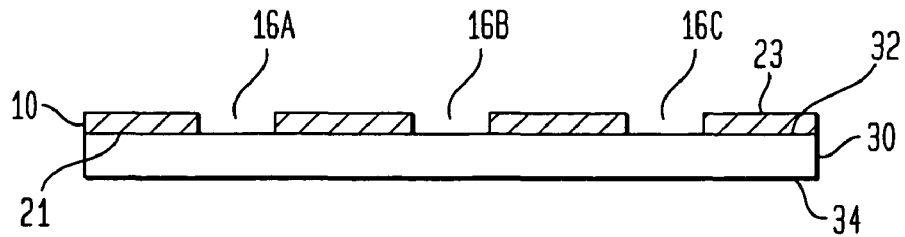
FIGS. 2A-2D, collectively referred to as FIG. 2, depict a process that uses the stencil in FIG. 1 to print solder paste on a substrate.
Figure 2B:
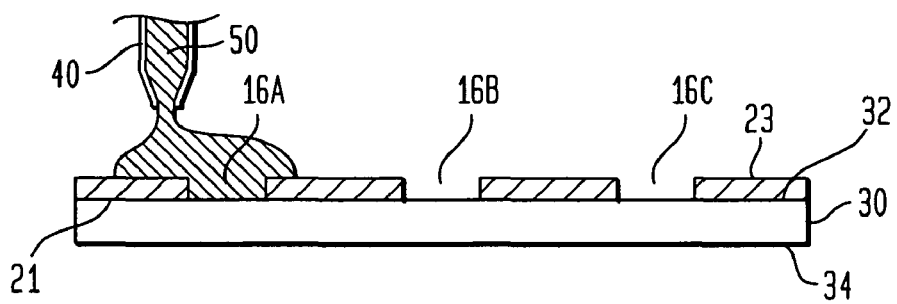
Figure 2C:
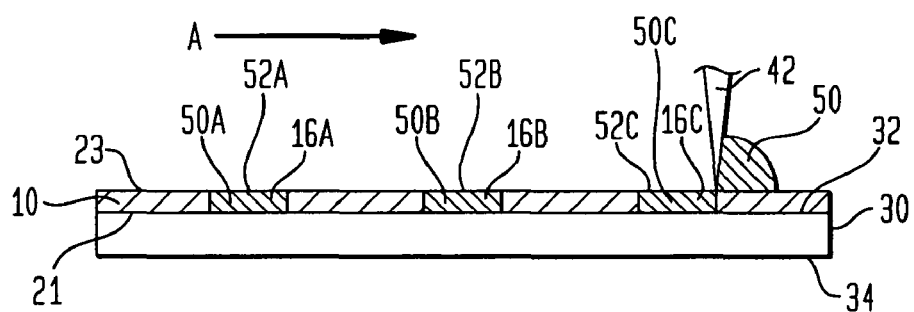

FIG. 2A shows the placement of the stencil 10 of FIG. 1 against the device 30 such that exterior surface 21 contacts front device surface 32. In FIG. 2B, a dispenser 40 places flowable composition 50 in the form of solder paste on surface 23. As shown, the dispenser 40 allots solder paste in an amount that meets or exceeds that needed to fill through-holes 16A-16C. In FIG. 2C, a blade 42, in a wiping action as indicated by arrow A, is used to spread the solder paste 50 into to through-holes 16A-16C As a result, a perform is formed such that each through-hole 16A-16C the stencil 10 is substantially filled in a manner such that substantially identical, discrete solder-paste features 50A-50C occupy through-holes 16A-16C. In addition, top surfaces 52A-52C of the solder-paste features 50A-50C line in the same plane as surface 23 of the stencil.

Figure 2D:
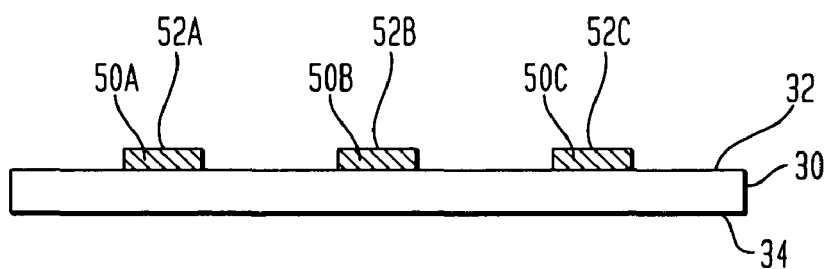
Figure 3A:
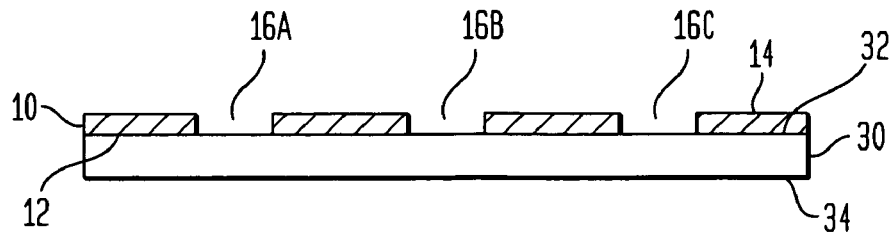
FIGS. 3A-3D, collectively referred to as FIG. 3, depict a process that uses a stencil similar to that depicted in FIG. 1 except without the polyceramic coating to print solder paste on a substrate and the problems associated with the process.
Figure 3B:
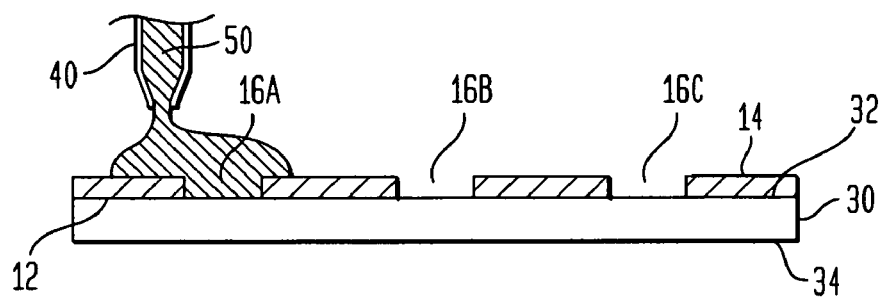
Figure 3C:
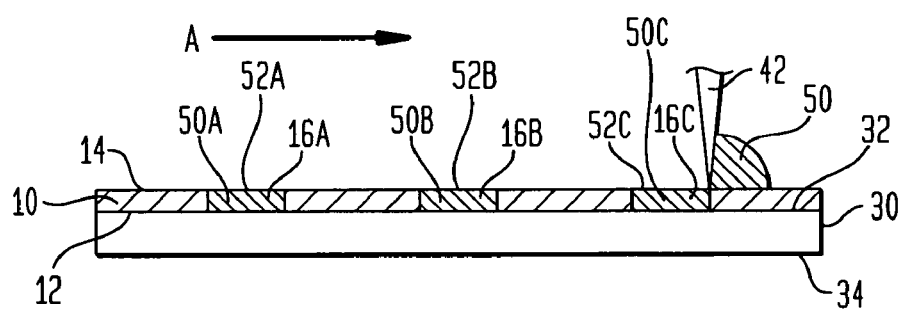
Figure 3D:
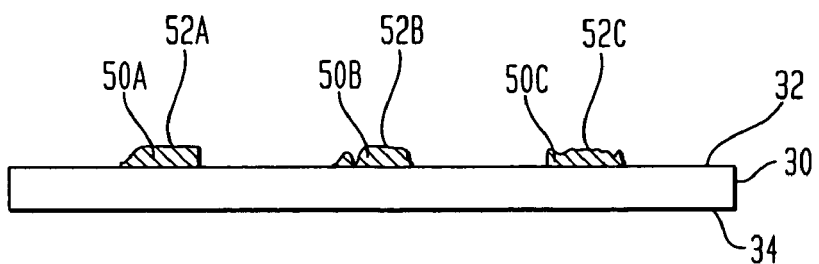

In FIG. 2D, the stencil 10 is removed from contact with the device 30. As a result, solder-paste features 50A-50C are exposed. Notably, the solder-paste features 50A-50C are depicted as retaining the shape of through holes 16A-16C. Accordingly, if the features undergo subsequent processing, e.g., reflow, at substantially identical conditions, the post-processing features should be substantially identical in size and shape as well.

It should be noted that any means may be used to place the flowable composition in simultaneous contact with the polyceramic coating and the receiving surface. Thus, while a dispenser and blade depicted in FIG. 2, other means may be additionally or alternatively used as well. For example, injectors, extruders, brushes, and other applicators known in the art may be used with the invention.

FIG. 3, in contrast, depicts the use of a stencil similar to that depicted in FIG. 1. Like FIGS. 2A-2C, FIGS. 3A-3C depict the placement of a stencil 10 against a device 30 and the filling of solder paste 50 into to through-holes 16A-16C of the stencil to form discrete solder-paste features 50A-50C. Unlike in stencil in FIG. 2, the stencil depicted in FIG. 3 does not include a polyceramic coating. When the stencil 10 is removed from contact with the device 30 in FIG. 3D, solder paste 50 uncontrollably adheres to the first, second, and/or luminal surfaces of the stencil. As a result, the solder-paste features 50A-50C do not retain the shape and/or size of through holes 16A-16C. That is, even though through-holes of 16A-16C of the stencil 10 depicted in FIG. 3 are identical in size and shape and are filled in a similar manner, the solder paste features formed using the stencil differ in size and shape.

Thus, it has been discovered that certain polyceramic coatings previously unknown in the processing of flowable compositions may be used to improve tolerances of items previously formed from the flowable compositions without use of such coatings. For example, solder balls used in semiconductor applications are manufactured in standard diameters ranging from about 300 μm to about 500 μm. Larger solder balls are also commonly available, and they may be individually placed onto a substrate. Solder balls having smaller diameters, e.g., 250 μm or less however, may require special production runs. One technique in which smaller solder balls are produced and accurately placed on a substrate in a cost effective manner involves the use of solder paste and stencil printing technology. A solder paste is placed onto a stencil in contact with a substrate, and a blade such as a squeegee is used to force the paste into the through holes of the stencil onto corresponding sites, e.g., bond pads, of the substrate to form solder paste features. The solder paste features are heated, typically in an oven with the substrate, to effect reflow, thereby producing a solder ball attached to the solder ball pad.

In some instances, as shown in FIG. 3, the solder paste adheres to the stencil rather than the substrate. As a result, many passes of the squeegee may be required to form solder balls of a consistent diameter. This adhesion problem is exacerbated with decreasing stencil through-hole size. Below certain sizes, consistent diameters are simply not achievable using ordinary stencil printing technique. Accordingly, the adhesion problem poses sufficient difficulties such that vendors of source mount technology are generally unwilling and unable to undertake production runs involving solder ball diameter of about 200 μm or less.

Figure 4:
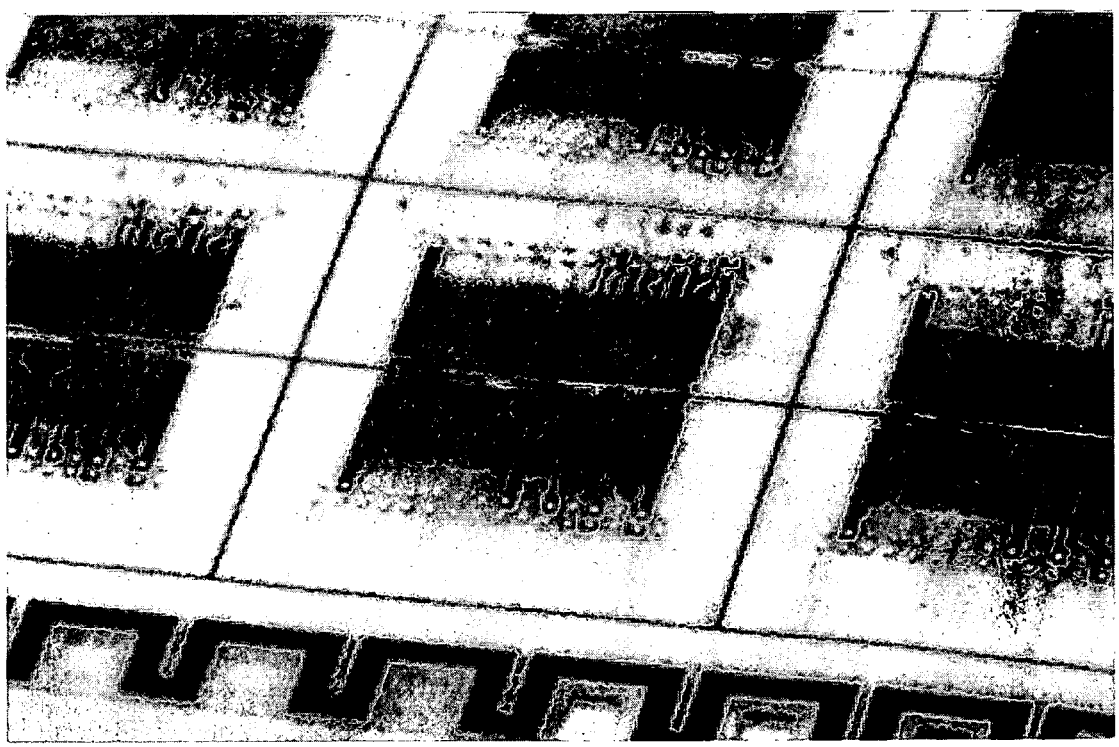
FIG. 4 is a micrograph that shows a microelectronic package that includes solder balls formed using a process similar to that depicted in FIG. 2

In contrast, it has been experimentally verified that applying a thin adhesion-resistant coating to a stencil significantly reduces the adhesion problem. A coating that resists adhesion to at least some components of solder paste, e.g., metallic solder, flux, etc., has been observed to allow for the formation of solder paste features of a consistent size and shape not previously achievable with a single pass of a squeegee. In particular, the adhesion-resistant coating allows for the formation of solder balls having diameters of 50 μm with no rework. As shown in FIG. 4, substantially identical solder balls having a diameter of about 50 μm may be formed using the process generally exemplified in FIG. 2 on microelectronic packages. Thus, with optimization, it is expected that an adhesion-resistant-coating may allow a stencil to form solder balls having a diameter as low as about 10 μm or about 25 μm and up in mass-manufacturing production runs.

In addition, it has been experimentally verified that polyceramic coatings may be advantageously used on tools that contact flowable compositions such as molding compounds. Such tools may include, for example, injection molding equipment. The coatings tend to improve the tool's release performance, provide wear protection, and offer greater corrosion resistance, all at the process temperatures for the flowable compositions. As a result, part and features formed using these tools exhibit greater dimensional control and precision.

Molding compounds typically are polymeric or polymerizable in nature. Polymeric molding compounds may, for example, include a thermoplastic such as polyethylene, polypropylene, polystyrene, polyesters, polyimides, copolymers thereof, and blends thereof. Polymerizable molding compounds, on the other hand, may include, without limitation, epoxy-based, polyesters-based, acrylate-based, and/or methacrylate-based formulations. Optionally, molding compounds may include one or more fillers. Such fillers may include graphitic or carbonaceous materials or may be metallic or ceramic in nature.

In particular, epoxy molding compounds (EMC) are often used in semiconductor applications. EMC typically also contain adhesion promoters to improve their adhesion to a substrate. Adhesion promoters, however, tend to cause EMC to adhere to other surfaces as well. In particular, EMC tend to adhere to surfaces of tools that come into contact with EMC, e.g., components of molding systems such as rams, barrows, runner plates, etc. To alleviate this unwanted adhesion, paraffin or other release material may be added to the EMC, though such release materials tend to reduce the efficacy of the adhesion promoter relative to the substrate. Furthermore, release materials may accumulate on tools surfaces without cleaning. Accordingly, the tools surface may be removed periodically, for example, by using a cleaner pellet instead of an EMC pellet in a molding system. In any case, formulation of EMC currently requires a delicate balance between the different components of the EMC so as to control the dimensions of the EMC features.

In short, it has been discovered that polyceramic materials are particularly suited for use as an adhesion-resistant coating for high-volume applications, as polyceramic coatings are highly durable and resistant to wear. For example, while fluoropolymeric, polyolefinic or silicone based release agents may be used to provide an adhesion-resistant coating, such coatings are not as durable and resistant to wear as polyceramic materials. In contrast, stencils having a polyceramic coatings on a surface thereof may be used to apply solder paste in runs of at least one hundred to one thousand printings or more without noticeable degradation in performance due to wear of the coating. Similarly, a mold having a polyceramic coating on a surface thereof may be used to process tens of thousands of shots of epoxy molding compounds without requiring a reapplication of the polyceramic coating.

The invention may be practiced using any of a number of tools known in the art or yet to be developed as long as the tool has a surface onto which a coating having the properties described herein may be placed. For example, the coating may be placed on known stencils for printing solder paste made from stainless steel or other metallic sheets. Similarly, the coating may be placed on a surface of a mold or other tool made from ceramic, semiconductor, polymeric, and/or metallic material. In particular, the coating may be advantageously used with tools made from materials that have all of the properties desired for a particular application except those surface properties that the coating provides.

Any of a number of polyceramic materials may be used to form the polyceramic coating. In general, the polyceramic coating is partially polymeric and contains carbon. The terms "polymer," "polymeric," and the like are used in their ordinary sense and refer to any of numerous natural and synthetic compounds formed from a plurality of monomeric units. Polymer such as dimers, trimers, and oligomers as well as compounds having extremely high molecular weights such as those formed from one-hundred or more monomeric units. In addition, the term polymer include, for example, homopolymers as well copolymers, linear as well as branch polymers, crosslinked as well as uncrosslinked polymers.

While $SiO_x$ is sometimes considered polymeric in nature, a coating consisting of $SiO_x$ is not considered a polyceramic. Nevertheless, the polyceramic coating may contain a —SiO moiety. For example, the —SiO moiety may be provided in silica particles in the coating. In addition, the —SiO moiety may be provided as a constituent of a polymer. Silicones such and polysiloxanes are well known polymers containing —SiO moieties in their backbone. Polymers having —SiO moieties pending from its backbone may be advantageously used as well.

In addition, the coating may contain a halogen. The term "halogen" is used in the conventional sense and refers, for example, to a fluoro, fluoride, chloro, chloride, bromo, bromide, iodo or iodide moiety. The halogen is typically a part of the polymeric portion of the coating. Thus, for example, when the polymeric portion of the coating contains an alkyl group such as a branched or unbranched saturated hydrocarbon group containing 1 to about 24 carbon atoms, such as methyl, ethyl, n-propyl, isopropyl, n-butyl, isobutyl, t-butyl, octyl, 2-ethylhexyl, decyl, and the like, the alkyl group may be halogenated. That is, such a coating may contain a halogenated alkyl group. Similarly, the polymeric portion of the coating may contain an alkenyl or alkynyl group, wherein at least one of the hydrogen atoms in the group is optionally replaced with a halogen atom. Furthermore, the polymeric portion of the coating may contain an alkoxy group, i.e., an alkyl group bound through a single, terminal ether linkage.

In general, the chemical structure of the coating may include or exclude any group or moiety according to the intended function of the coating. In some instances, the coating may contain cyclic and/or aromatic groups. For example, the coating may contain an aryl group having a univalent aromatic substituent containing a single aromatic ring or multiple aromatic rings that are fused together or linked covalently. Similarly the coating may contain an arylene group having a divalent aromatic substituent containing a single aromatic ring or multiple aromatic rings that are fused together or linked covalently. Exemplary aryl and arylene groups may contain an aromatic ring or a plurality of fused or linked aromatic rings. However, heterocyclic moieties may be included as an alternative or additional constituent. Aryl and arylene groups contain one or more substituent groups or have at least one carbon atom is replaced with a heteroatom. Exemplary polymers containing cyclic moieties include polycarbonate, polyimide, polyethylene terephthalate, and polystyrene. In particular, polymer families such as polyarylene ethers, polyarylenes, parylenes, polyimides, aromatic hydrocarbons, benzocyclobutenes are known in the semiconductor microelectronic industry.

In any case, the coating may be fluorinated, chlorinated, or both. For example, the above-mentioned polymers and polymer families may be fluorinated or chlorinated by methods known in the art. Exemplary commercially available fluorinated and/or chlorinated polymers include polyvinylchloride, polyvinylfluoride, polyvinylidene fluoride, polyvinylidene chloride, polychorotrifluoroethylene, polytetrafluoroethylene, polyhexafluoropropylene, and copolymers thereof.

As alluded to above, ceramic filler particles are included as a component of the polyceramic coating. Nevertheless, semiconductor and/or metallic filler particles may also be used to enhance the mechanical, electrical, or optical properties of the film. The particles may be crystalline or amorphous in nature. Exemplary ceramic particles suitable for use with the invention include, oxides such as silica, alumina, zirconia, and titania, nitrides such as silicon nitride, and titanium nitride, and metal halides. Depending on the intended application, single metal or mixed metal ceramics may be used.

The polyceramic coating may be bonded to any surface of the tool. Typically, the coating is bonded to at least a portion of any surface that may come into contact with the flowable composition. Accordingly, when the tool has one or more major surfaces, the coating is typically bonded to a major surface that may come into contact with the flowable composition. For example, when a tool includes a stencil that has front and rear surfaces, the coating is bonded to the front surface, the rear surface, or both surfaces. In addition or in the alternative, the coating may be bonded to one or more other surfaces that may or may not be a major surface. In any case, depending on the intended application, an entire surface or merely a portion thereof may have a polyceramic coating bonded thereto. Optionally, more than one type of polyceramic coating may be employed in conjunction with the invention.

The polyceramic coating is generally formed by dispensing one or more fluids onto one or more surfaces of a tool. As used herein, the term "fluid" as used herein refers to matter that is not completely solid and is at least partially gaseous and/or liquid. In particular, a "precursor fluid" fluid may contain a solid that is minimally, partially, or fully solvated, dispersed, or suspended and that will ultimately be incorporated into the polyceramic coating to be formed. Examples of fluids include gases such as mixtures of an inert gas and a reactive polymerizable gas, aqueous liquids such as water-based emulsions, and nonaqueous liquids such as organic solvents having polymers dissolved therein, or suspensions such as a composition containing solid particulates suspended in a liquid. Once the fluid is dispensed, the fluid may be subjected to conditions effective to produce a polyceramic coating bonded to the one or more surfaces onto which the fluid is dispensed. Optionally, the surface or surfaces of the tool onto which the fluid is dispensed may be pretreated to promote adhesion of the polyceramic coating thereon. Such pretreatment may or may not involve the use of a precursor fluid. For example, a surface may be cleaned to promote adhesion of the polyceramic coating using a cleaning fluid that does not leave any residue. In addition, a surface may be primed using a precursor fluid that will facilitate the formation of a strong polyceramic/surface bond.

Depending on factors such as the fluid dispensed, the dispensing technique and the conditions to which the dispensed fluid is subjected, the microstructure of the polyceramic coating formed may differ. For example, the polyceramic coating may be formed by dispensing a liquid coating material via wiping, casting, spin coating, spray coating, printing or other techniques. In addition, vapor phase fluid deposition techniques may be used as well. Often, vapor phase deposition involves vacuum deposition techniques used in semiconductor fabrication. Such vacuum processes include, but are not limited to, physical vapor deposition, chemical vapor deposition, and evaporation. Due to the greater mobility gases relative to liquids, however, coatings produced through vapor phase deposition tend to exhibit a microstructure that conforms more closely to the surface on which they are formed than coatings formed by solvent casting.

In some instances, the polyceramic coating may be formed through in situ polymerization or crosslinking. For example, a fluid containing monomers may be dispensed onto a member surface for polymerization. The polymerization may be effected, e.g., through thermal, chemical, or photolytic curing. Thermally curable polymers tend to require heating of the fluid. Chemically curable polymers tend to require an appropriate curing agent. Exemplary polymerization mechanisms include step polymerization and addition polymerization. Optionally, a polymer formed from such techniques may be terminated with a moiety different from the remaining portion thereof. For example, modified phenoxy binders may be used in conjunction with the invention In the alternative, precursor fluids containing already-formed polymers may be deposited directly onto the surface to form the polyceramic coating. For example, thermoplastic polymers, i.e., polymers having a relatively large window of thermostability, may be deposited using processes that involve involving extrusion and/or injection. In addition, solvents may be used to dissolve polymers for dispensing. Once dispensed, the solvent may be evaporated through the application of heat and/or vacuum. One of ordinary skill in the art will recognize that the solubility of a particular polymer in a particular solvent will depend in large part by the polarity of polymer and the solvent. Polymers tend to exhibit a high solubility in solvents of like polarity and a low solubility in solvents of dissimilar polarity. Thus, for example, chlorobenzotrifluoride, is a particularly desirable solvent for polymers and/or monomers containing a benzyl and/or a halogen moiety.

Polyceramic coating such as those marketed by NIC Industries (White City, Oreg.) under the trademark Cerakote™ have previously been used in the contexts of clear protection, performance motor sports, industrial coating applications, firearms coatings, gas turbine engine coatings, and decorative performance coatings. For example, polyceramic coatings have been applied on the surfaces of public structures and buildings to repel paints and other substances used for apply graffiti. In addition, such coatings have been applied as paint to sump trucks, heavy equipment, etc., to prevent hot asphalt from adhering thereto. Typically, such coatings exhibit high chemical and corrosion resistance, e.g., resistant to attack by solvents acids, and bases, exceptional hardness, and outstanding UV resistance. In addition, such coatings can be removed by laser ablation without vaporizing in a manner such that the vapors condense back onto the laser.

As discussed above, number of experiments have been performed, the results of which support the discovery that a polyceramic coating may improve the release performance of tools for applying a flowable composition. The experiments focused on the polyceramic from a precursor formulation from NIC Industries designated MC-226 HT MAR MICRO CLEAR. This formulation is provided as a proprietary mixture of chlorobenzotrifluorides, solids, and reactive compounds for forming a silica-based polyceramic coating. However, it is expected that other polyceramic formulations will yield similar results. For example, the formulations described in U.S. Pat. Nos. 5,853,894; 6,156,389; 6,447,979; 6,495,624; 6,663,941; and 6,767,587, particularly those involving perfluorinated mono-functional or multifunctional silanes, may be suited for use with the invention.

In general, MC-226 HT MAR MICRO CLEAR tends to produces a covalent bond with the surface to which it is applied. Typically, covalent bonding is established between the coating and the tool surface member. Covalent bonding tends ensure that the interface between the coating and the tool surface is susceptible to attack or to debonding. Acceptable adhesion between the coating and the tool surface may be achieved through ionic or van der Waal forces as well.

The coating may have a thickness of about 1 µm to about 50 µm. For example, a typical coating may have a thickness of about 5 µm to about 20 µm. Optimally, the thickness of the coating is substantially uniform, e.g., has a thickness of about 10 µm and/or does not deviate from the mean by more than about 10%. The coating thickness may be determined by the composition of the precursor fluid, e.g., the proportion of solvent to solvate, and/or by the technique by which the fluid is applied.

Precursor fluids for conformal polyceramic coatings may be applied to the tool surfaces, e.g., stencil and/or mold surface, using any of a number of techniques. As alluded to above, such fluids may be applied by wiping, brushing, spraying, and dipping. In most instances, a single application is sufficient to produce an adhesion resistant coating. In particular, it has been found that the precursor fluid designated MC-226 HT MAR MICRO CLEAR is exceptionally easy to use. Although the fluid requires 5 days for full curing after its application on a tool surface, a mold has been successfully used with EMC after the precursor fluid has been cured for only 24 hours.

Once a polyceramic coating is formed on a surface of a tool, the coating may be cleaned by wiping action, with or without a solvent keyed to the flowable material to be removed from the tool. For example, polyceramic-coated stencils for printing solder paste may be cleaned by wiping with isopropyl alcohol.

Variations of the present invention will be apparent to those of ordinary skill in the art. For example, different isomers of chlorobenzotrifluoride, e.g., ortho, para, meta, may be used as a solvent/suspension medium for a polyceramic precursor fluid. Other aromatic, chlorinated and/or fluorinated solvents/suspension media may be used as well. Additional variations of the invention may be discovered upon routine experimentation without departing from the spirit of the present invention.

It is to be understood that, while the invention has been described in conjunction with the preferred specific embodiments thereof, the foregoing description merely illustrate and not limit the scope of the invention. Numerous alternatives and equivalents exist which do not depart from the invention set forth above. Other aspects, advantages, and modifications within the scope of the invention will be apparent to those skilled in the art to which the invention pertains.

All patents and patent applications mentioned herein are hereby incorporated by reference in their entireties.

As these and other variations and combinations of the features discussed above can be utilized without departing from the invention as defined by the claims, the foregoing description of the preferred embodiments should be taken by way of illustration rather than by way of limitation of the invention as defined by the claims.

The invention claimed is:

1. An apparatus for applying a flowable composition onto a receiving surface, comprising:
   a stencil tool for use on a microelectronic element, the stencil tool having a polyceramic coating thereon;
   a means for placing the flowable composition on a semiconductor in simultaneous contact with the polyceramic coating and the receiving surface;
   wherein the polyceramic coating provides adhesion resistance to the flowable composition for removal of the stencil tool from the receiving surface.

2. The apparatus of claim 1, wherein the stencil tool comprises a stencil.

3. The semiconductor member of claim 1, wherein the polyceramic coating contains a —SiO moiety.

4. The semiconductor member of claim 3, wherein the polyceramic coating contains silica.

5. The semiconductor member of claim 3, wherein the —SiO moiety represents a portion of a polymeric backbone.

6. The semiconductor member of claim 3, wherein the —SiO moiety is pendant from a polymeric backbone.

7. The semiconductor member of claim 3, wherein the coating contains a cyclic moiety.

8. The semiconductor member of claim 7, wherein the cyclic moiety is a benzyl moiety.

9. The semiconductor member of claim 1, wherein the polyceramic coating is fluorinated, chlorinated, or both.

* * * * *